United States Patent
Kushnick (10) Patent No.: US 7,805,628 B2
(45) Date of Patent: Sep. 28, 2010

(54) HIGH RESOLUTION CLOCK SIGNAL GENERATOR

(75) Inventor: Eric B. Kushnick, Alamo, CA (US)

(73) Assignee: Credence Systems Corporation, Milpitas, CA (US)

( * ) Notice: Subject to any disclaimer, the term of this patent is extended or adjusted under 35 U.S.C. 154(b) by 2063 days.

(21) Appl. No.: 09/824,898

(22) Filed: Apr. 2, 2001

(65) Prior Publication Data

US 2002/0178391 A1    Nov. 28, 2002

(51) Int. Cl.
G06F 1/08    (2006.01)
(52) U.S. Cl. ...................... 713/501; 713/503
(58) Field of Classification Search .................. 713/501, 713/503
See application file for complete search history.

(56) References Cited

U.S. PATENT DOCUMENTS

| | | | |
|---|---|---|---|
| 3,928,813 A | 12/1975 | Kingsford-Smith | |
| 5,471,165 A * | 11/1995 | Liedberg | 327/250 |
| 5,604,775 A * | 2/1997 | Saitoh et al. | 375/376 |
| 5,670,904 A * | 9/1997 | Moloney et al. | 327/277 |
| 5,712,883 A | 1/1998 | Miller et al. | |
| 5,764,710 A | 6/1998 | Cheng et al. | |
| 5,790,609 A | 8/1998 | Swoboda | |
| 5,838,754 A * | 11/1998 | Gorbics et al. | 377/20 |
| 5,956,374 A | 9/1999 | Iwamatsu | |
| 6,100,735 A * | 8/2000 | Lu | 327/158 |
| 6,154,165 A | 11/2000 | Gross, Jr. | |
| 6,194,928 B1 * | 2/2001 | Heyne | 327/152 |
| 6,259,330 B1 * | 7/2001 | Arai | 331/57 |
| 6,265,924 B1 * | 7/2001 | Desai | 327/276 |
| 6,310,570 B1 | 10/2001 | Rumreich et al. | |
| 6,327,196 B1 | 12/2001 | Mullarkey | |
| 6,388,485 B2 * | 5/2002 | Kim | 327/161 |

OTHER PUBLICATIONS

Christiansen et al., "TTCrx Reference Manual", Jul. 1997, Version 2.2.*

* cited by examiner

*Primary Examiner*—Tse Chen (57) ABSTRACT

A clock signal generator having first and second coarse delay circuits connected in series delays pulses of a reference signal having period $T_p$ to produce pulses of the clock signal. The first coarse delay circuit delays pulses of the reference signal with a delay resolution of $T_p/N$ seconds over a range spanning $T_p$ seconds to produce pulses of an output signal. The second coarse delay circuit delays pulses of the output signal of the first coarse delay circuit over a range spanning $T_p$ seconds with a delay resolution of $T_p/M$ seconds to provide pulses of the clock signal with a timing resolution of $T_p/(M*N)$ seconds when the integers N and M are relatively prime.

36 Claims, 4 Drawing Sheets

HIGH RESOLUTION CLOCK SIGNAL GENERATOR

BACKGROUND OF THE INVENTION

1. Field of the Invention

The present invention relates in general to programmable clock signal generators and in particular to a high resolution programmable clock signal generator for providing a clock signal selected from a set of timing signals.

2. Description of Related Art

Figure 1:
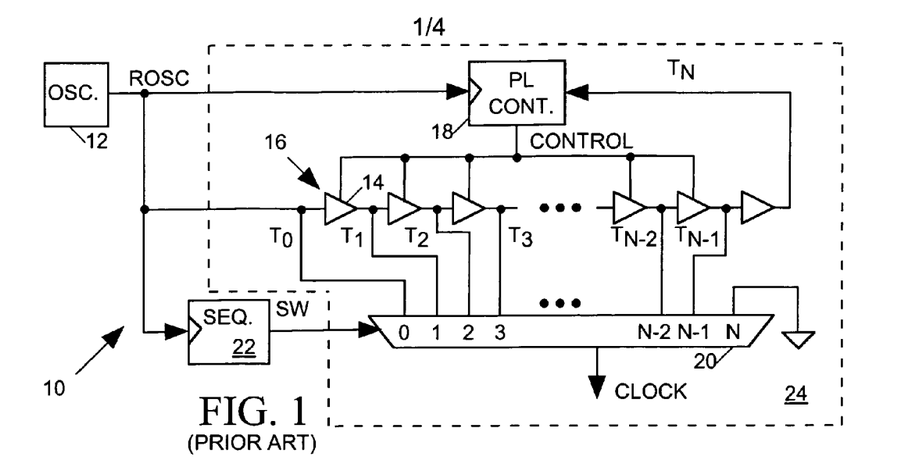
FIG. 1 depicts a prior art clock signal generator in block diagram form.

FIG. 1 depicts in block diagram form a prior art clock signal generator 10 for providing an adjustable frequency clock signal CLOCK synchronized to a reference clock signal ROSC provided by a stable oscillator 12. Clock signal generator 10 includes a set of N logic gates 14 connected in series to form a delay line 16 providing a set of N tap signals $T_0$-$T_{N-1}$ at the outputs of gates 14. Each gate 14 has a signal delay of $T_P/N$ so that each tap signal $T_k$ is delayed with respect to the ROSC signal by an interval of $P_D=(k/N)*T_p$, where $T_p$ is the period of the ROSC signal.

The ROSC signal and tap signal $T_N$ serve as inputs to a conventional phase lock (PL) controller 18 supplying a control signal (CONTROL) to all gates 14. The magnitude of the CONTROL signal controls the switching speed of the gates 14. When tap signal $T_N$ lags the ROSC signal, controller 18 sets the CONTROL signal voltage to increase the switching speed of gates 14, and when tap signal $T_N$ leads the ROSC signal, controller 18 adjusts the CONTROL signal voltage to decrease the switching speed of gates 14. Thus controller 18 compares signal ROSC to signal $T_N$ and adjusts the switching speed of all gates 14 to phase lock the $T_N$ signal to the ROSC signal, thereby making each gate 14 have the desired signal delay of $T_P/N$.

A multiplexer 20 having N+1 inputs 0-N produces the output signal CLOCK. Tap signals $T_0$-$T_{N-1}$ drive inputs 0-(N−1) of multiplexer 20 and input N of multiplexer 20 is grounded. Multiplexer 20 controls the timing of each pulse edge of the CLOCK signal by selecting one of its input signals. A sequencer 22 responds to each ROSC signal pulse by providing control data SW telling multiplexer 20 which input signal $T_0$-$T_{N-1}$ (or ground) to select. Delay line 16, PL controller 18 and multiplexer 20 form a programmable delay circuit 24 for delaying any ROSC signal pulse with a delay determined by the input SW data to produce a CLOCK signal pulse. The sequence of SW data values therefore controls the timing of each pulse of the CLOCK signal, and thereby controls the phase and frequency of the CLOCK signal.

Figure 2:
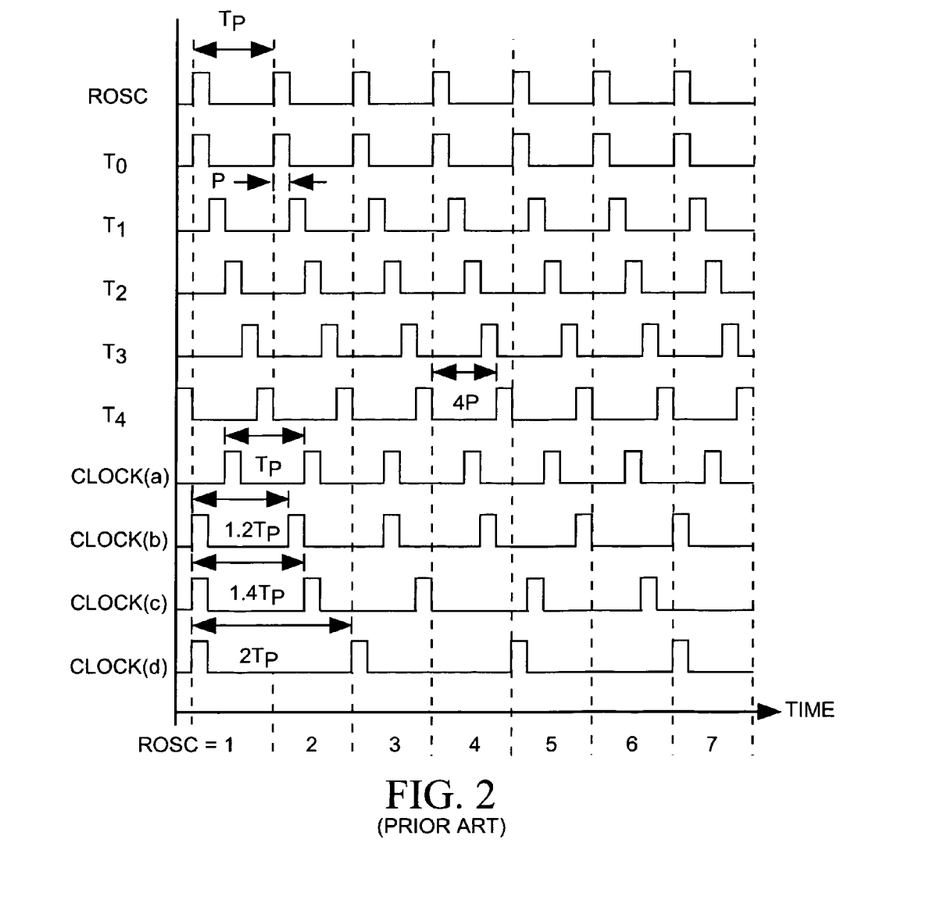
FIG. 2 is a timing diagram illustrating timing relationships between various signals of a prior art clock signal generator similar to the prior art clock signal generator of FIG. 1.

FIG. 2 is a timing diagram illustrating various signals associated with clock signal generator 10 of FIG. 1 in which N=5 and thus five gates 14 form delay line 16. In this example the five gates provide five tap signals $T_0$-$T_4$ as input signals to multiplexer 20 inputs 0-4. Multiplexer input $T_5$ is grounded. The ROSC signal and input signals $T_0$-$T_4$ all have the same frequency. Input signal $T_1$ is delayed with respect to the ROSC signal by $P_D=T_p/5$, the switching delay of one gate 14. Each successive signal of the remaining input signals $T_k$ is delayed with respect to the ROSC signal by $k*P_D$. Thus, for example, $T_4$ is delayed with respect to the ROSC signal by $4P_D$.

FIG. 2 also illustrates examples CLOCK(a)-CLOCK(d) of output signal CLOCK provided in response to four different SW signal patterns produced by sequencer 22 of FIG. 1. Suppose we want an output signal CLOCK(a) having the same frequency as ROSC but being shifted in phase by $2P_D$. To do this we program sequencer 22 to set signal SW so that multiplexer 20 selects input signal $T_2$ on each cycle of the ROSC signal. Thus, signal SW supplies a sequence of data values to multiplexer 20 of the form SW={2, 2, 2, . . . }. As shown in FIG. 2 the resultant signal CLOCK(a) is shifted in phase by 2P with respect to the ROSC signal.

Alternatively, when we want clock signal generator 10 to produce an output signal CLOCK(b) having a period equal to $1.2T_p$, we program sequencer 22 to set signal SW to value SW=0 for the first ROSC period and then switch signal SW to value SW=1 at the start of the second ROSC period and so on. Since CLOCK(b) is of lower frequency than ROSC, sequencer 22 must occasionally instruct multiplexer 20 to select its grounded input 5. In this example this occurs during every sixth ROSC cycle. Thus, to produce CLOCK(b) signal SW is a repetitive sequence of the form SW={0, 1, 2, 3, 4, 5 . . . }.

When we want clock signal generator 10 to produce an output signal CLOCK(c) with a period equal to $1.4T_p$, we program sequencer 22 to generate a repeating SW signal sequence of the form SW={0, 2, 4, 5, 1, 3, 5 . . . }. A repetitive SW sequence of the form SW={0, 5, 0, 5 . . . } produces an output signal CLOCK(d) with a period twice that of the ROSC signal, or $2T_p$.

Thus, clock signal generator 10 can produce a variety of output clock signals CLOCK whose frequencies depend on the programming of sequencer 22. However, the resolution with which the clock signal generator 10 can adjust the period of the CLOCK output signal is limited to $P_D=T_P/N$, the delay of one gate 14.

By increasing the number N of gates 14 in delay line 16 we can improve the period resolution $P_D$ of clock signal generator 10. However, since all gates 14 must switch in succession during a single ROSC clock period, there is a limit to the number of gates that can be included in delay line 16. Thus, the resolution $P_D=T_P/N$ of clock signal generator 10 can be no smaller than the minimum switching speed of gates 14.

Figure 3:
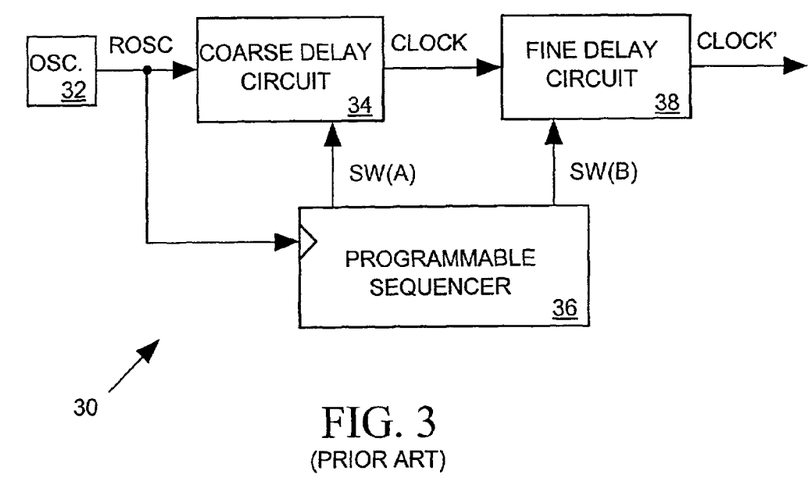
FIG. 3 depicts in block diagram form a prior art clock signal generator having a coarse delay circuit and a fine delay circuit.

FIG. 3 depicts in block diagram form a prior art clock signal generator 30 for generating clock signals with a higher period resolution than possible with clock signal generator 10 of FIG. 1. In FIG. 3 a stable oscillator 32 provides a ROSC pulse with period $T_p$ to a "coarse" delay circuit 34 similar to the programmable delay circuit 24 of FIG. 1 which can delay a pulse of the ROSC cycle to produce a CLOCK signal pulse with a delay of up to $T_p$ adjustable with a "coarse" resolution of $T_P/N$. A "fine" delay circuit 38 further delays each CLOCK signal pulse with an adjustable delay over a narrow range of up to $T_p/N$ with a "fine" resolution of $T_p/(M*N)$. In response to each ROSC signal pulse, a programmable sequencer 36 provides SW(A) data to coarse delay circuit 34 telling it how much to delay the ROSC pulse to produce a CLOCK signal pulse and provides SW(B) data to fine delay circuit 38 telling it how much to delay the CLOCK pulse to produce a CLOCK' signal pulse. Thus the total delay between a ROSC signal pulse and a corresponding CLOCK' signal pulse is $D_T=j*T_p/N+k*T_p/(M*N)$, where $0 \leq j \leq N$ and $0 \leq k \leq M$. Thus the period resolution of clock signal generator 30 is $P_D=T_p/(M*N)$ over the range spanning $T_p$.

Figure 4:
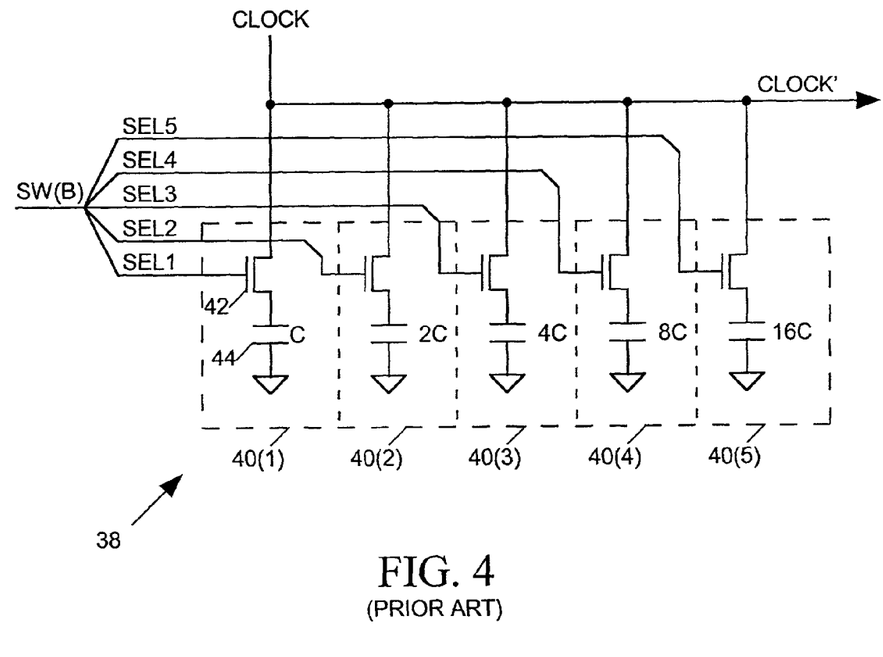
FIG. 4 depicts the fine delay circuit of FIG. 3 in more detailed block diagram form.

FIG. 4 depicts prior art fine delay circuit 38 in more detailed block diagram form in an example where M=32. A set of five delay modules 40(1)-40(5) connect to the output of delay circuit 34 of FIG. 3. Each module 40(1)-40(5) has a pass gate 42 and a capacitor 44 connected in series between the CLOCK signal line and ground. Each bit SEL1-SEL5 of the input 5-bit control data SW(B) controls whether the pass gate 42 of a corresponding module 40(1)-40(5) is open or closed. When a gate 42 is open its respective capacitor 44 has no effect on a CLOCK signal pulse. When a gate 42 is closed its respective capacitor 44 increases the delay between the CLOCK and CLOCK' signals.

In the example of FIG. 4 the capacitors 44 range in value from C to 16C where the value of C is chosen so that a total capacitance of kC is connected to the CLOCK signal line adding a delay of $kT_p/(M*N)$ to a CLOCK signal pulse. Thus a pulse of the CLOCK signal can be delayed over a range spanning up to $T_p/N$ with a delay resolution of $T_p/(M*N)=T_p/(N*(2^5))=T_p/32N$ to provide a CLOCK' signal pulse, depending on the amount of capacitance gates 42 link to the CLOCK signal line.

In contrast to coarse delay circuit 34, where a delay line 16 (FIG. 1) is phase-locked to a stable reference signal ROSC and thus provides a highly accurate and "self-calibrating" delay resolution, delay modules 40(1)-40(5) of fine delay circuit 38 must be calibrated to establish an accurate delay resolution for this circuit. The calibration process is difficult and time-consuming.

Thus we cannot increase the period resolution of the clock signal generator 10 of FIG. 1 by increasing the number N of gates 14 beyond that point at which the resolution becomes smaller than the minimum possible gate switching time. And, although we can enhance the period resolution of clock signal generator 10 through the use of fine delay circuit 38 (FIG. 4), calibration of fine delay circuit 38 is problematic. Since many potentially useful applications for clock signal generators require higher clock period resolutions than are attainable with clock signal generator 10, what is needed is a self-calibrating clock signal generator with a high period resolution.

BRIEF SUMMARY OF THE INVENTION

In accordance with a first aspect of the invention, a clock signal generator includes two programmable delay circuits, a first of which adjustably delays pulses of a periodic reference signal over a range spanning at least $T_p$ seconds where $T_p$, is the period of the reference signal with a delay resolution of $T_p/N$ seconds to provide an output signal. The second delay circuit adjustably delays the output signal of the first delay circuit over a range spanning at least $T_p$ seconds with a delay resolution of $T_p/M$ seconds to provide an output clock signal. Thus the total delay of the output clock signal is $T_D=j*T_p/N+k*T_p/M=(j*M+k*N)*T_p/N*M$. Where j and k are the number of unit delays provided by the first and second programmable delay circuits respectively.

In accordance with a second aspect of the invention the values of N and M are selected so that they are "relatively prime", having no common factors other than one. Thus the resolution with which the clock signal generator can delay a reference signal pulse, and therefore set the period of its output clock signal, is $T_p/(M*N)$.

In accordance with a third aspect of the invention both programmable delay circuits use phase-locked delay lines phase-locked to the reference signal to control the delay of their respective input signals. Thus both delay circuits are self-calibrating.

It is accordingly an object of the invention to provide a clock signal generator that can adjust a period of an output clock signal with high resolution.

The claims portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DETAILED DESCRIPTION OF THE INVENTION

Figure 5:
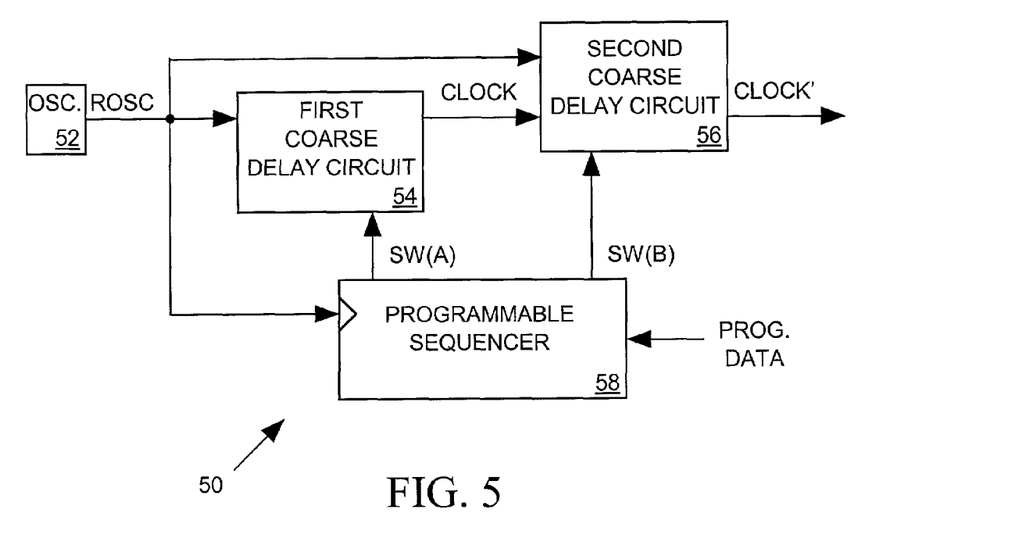
FIG. 5 depicts in block diagram form a high resolution clock signal generator in accordance with the invention employing two coarse delay circuits.

FIG. 5 depicts in block diagram form a high resolution programmable clock signal generator 50 in accordance with the invention for generating pulses of an output CLOCK' signal by adjustably delaying pulses of a periodic reference signal ROSC having a period $T_p$ through a pair of coarse delay circuits 54 and 56 connected in series. First coarse delay circuit 54 adjustably delays pulses of the ROSC signal over a range spanning at least $T_p$ seconds with a resolution of $T_p/N$ to provide output CLOCK signal pulses. The second coarse delay circuit 56 adjustably delays the CLOCK signal pulses over a range spanning $T_p$ seconds with a resolution of $T_p/M$ to provide pulses of the output CLOCK' signal.

Although clock signal generator 50 and prior art clock signal generator 30 of FIG. 3 appear topologically somewhat similar, clock signal generator 30 employs one coarse delay circuit 34 and one fine delay circuit 38 whereas clock signal generator 50 employs two coarse delay circuits. A "coarse" delay circuit is capable of delaying ROSC pulses over a broad range (e.g., spanning $T_p$ seconds) with a low resolution (e.g. $T_p/N$). While a "fine" delay circuit is capable of delaying pulses over a narrow range (e.g., spanning $T_p/N$ seconds) with a high resolution ($T_p/(M*N)$). Even though neither coarse delay circuit 54 or 56 of FIG. 5 has as high a delay resolution as fine delay circuit 38 of FIG. 3, clock signal generators 30 and 50 have the same period resolution, $T_p/(M*N)$; much higher than the resolution of either delay circuit 54 or 56.

Referring to FIG. 5, the total delay $D_T$ between a ROSC signal pulse input and a CLOCK' signal pulse output of clock signal generator 50 may be expressed as $$D_T=(j/N)*T_p+(k/M)*T_p=((j*M+k*N)/(M*N))*T_p \quad [1]$$

where integer j represents the number of unit delays $T_p/N$ provided by delay circuit 54 and integer k represents the number of unit delays $T_p/M$ provided by delay circuit 56.

Consider a simple example where N=4 and M=5 and the delay indices j and k range from 0-3 and 0-4 respectively. For N=4 delay circuit 54 has a delay resolution of $T_p/4=0.25T_p$ and for M=5 delay circuit 56 has a delay resolution of $T_p/5=0.2T_p$. For this choice of N and M the total delay of clock signal generator 50 is $$D_T=((5j+4k)/20)*T_p \quad [2]$$

Table I lists the delay values, in units of $T_p$, for various choices of the indices j and k in equation [2]

TABLE I

| j | k | Actual Delay ($T_p$) | Effective Delay ($T_p$) |
|---|---|---|---|
| 0 | 0 | 0/4 + 0/5 = 0/20 | 0/20 |
| 1 | 4 | 1/4 + 4/5 = 21/20 | 1/20 |
| 2 | 3 | 2/4 + 3/5 = 22/20 | 2/20 |
| 3 | 2 | 3/4 + 2/5 = 23/20 | 3/20 |
| 0 | 1 | 0/4 + 1/5 = 4/20 | 4/20 |
| 1 | 0 | 1/4 + 0/5 = 5/20 | 5/20 |
| 2 | 4 | 2/4 + 4/5 = 26/20 | 6/20 |
| 3 | 3 | 3/4 + 3/5 = 27/20 | 7/20 |
| 0 | 2 | 0/4 + 2/5 = 8/20 | 8/20 |
| 1 | 1 | 1/4 + 1/5 = 9/20 | 9/20 |
| 2 | 0 | 2/4 + 0/5 = 10/20 | 10/20 |
| 3 | 4 | 3/4 + 4/5 = 31/20 | 11/20 |
| 0 | 3 | 0/4 + 3/5 = 12/20 | 12/20 |
| 1 | 2 | 1/4 + 2/5 = 13/20 | 13/20 |
| 2 | 1 | 2/4 + 1/5 = 14/20 | 14/20 |
| 3 | 0 | 3/4 + 0/5 = 15/20 | 15/20 |
| 0 | 4 | 0/4 + 4/5 = 16/20 | 16/20 |
| 1 | 3 | 1/4 + 3/5 = 17/20 | 17/20 |
| 2 | 2 | 2/4 + 2/5 = 18/20 | 18/20 |
| 3 | 1 | 3/4 + 1/5 = 19/20 | 19/20 |

In Table I the actual delay values represent the total ROSC signal pulse delay for particular choices of indices j and k. For example, a choice of (j,k)=(3, 4) sets clock signal generator 50 to provide a CLOCK' signal pulse by delaying a ROSC signal pulse through $3T_p/4$ and then $4T_p/5$ to yield a total delay of $31T_p/20$. However since the total delay provided by either of coarse delay circuits 54 or 56 spans $T_p$ seconds a CLOCK' signal pulse delay value of $31T_p/20=T_p+11T_p/20$ is indistinguishable from an effective CLOCK' signal pulse delay value of $(T_p+11T_p/20)-T_p=11T_p/20$.

From the effective delay values listed in Table I it can be seen that when N=4 and M=5, clock signal generator 50 can adjust the timing of CLOCK' signal pulses with a resolution $T_p/(M*N)=T_p/20$ over a range of 0 to $19T_p/20$, or 0 to $0.95T_p$. This is the same resolution provided by prior art clock signal generator 30 of FIG. 3 when N=4 and M=5 over the range spanning $T_p$. A resolution of $T_p/20$ represents a significant improvement over either the resolution $T_p/4$ of delay circuit 54 or the resolution $T_p/5$ of delay circuit 56 alone.

Figure 6:
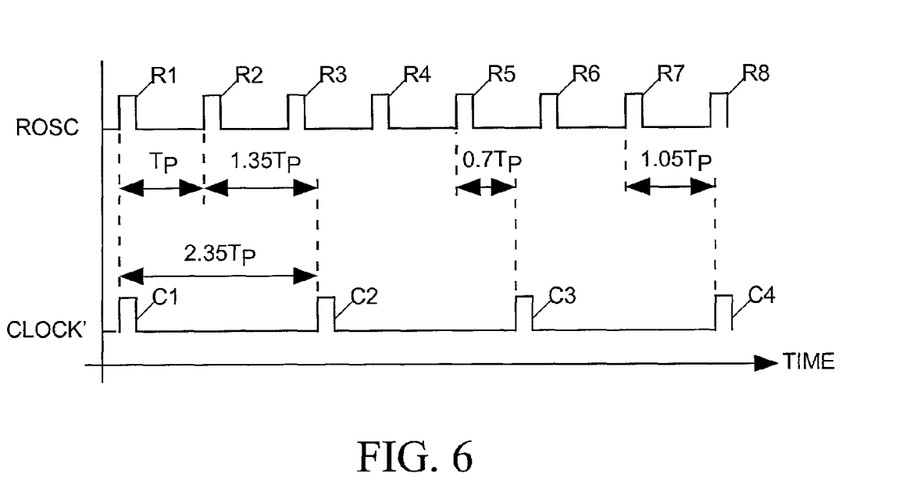
FIG. 6 is a timing diagram illustrating timing relationships between the ROSC and CLOCK' signals of FIG. 5 when the period of the CLOCK' signal is 2.35 times the period of the ROSC signal.

Clock signal generator 50 can be programmed to produce a variety of different CLOCK' signal periods by appropriately delaying selected ROSC signal pulses. FIG. 6 is a timing diagram showing the timing relationship between a series of ROSC signal pulses R1-R8 in an example where clock signal generator 50 is programmed to produce a series of CLOCK' output signal pulses C1-C3 having period 2.35*$T_p$, when N=4 and M=5. The first ROSC signal pulse R1 passes without delay to produce the first CLOCK' signal pulse C1. The second ROSC pulse R2 is delayed by $1.35T_p$ to produce the second CLOCK' signal pulse C2. The fifth ROSC pulse R5 is delayed by $0.7T_p$ to produce the third CLOCK' signal pulse C3 and the fourth CLOCK' signal pulse C4 is produced by delaying the seventh ROSC signal pulse R7 by $1.05T_p$.

Table II lists the SW(A) and SW(B) data values sequencer 58 produces in response to the first eight ROSC signal pulses R1-R8 (FIG. 6) for clock signal generator 50 to provide a CLOCK' signal period of $2.35T_p$ when N=4 and M=5. The values of SW(A) and SW(B) listed in Table II reference the delay indices j and k respectively. When a ROSC pulse must be blocked from passing through either first coarse delay line 54 or second delay line 56, sequencer 58 sets control data values SW(A) or SW(B) to a particular value X.

TABLE II

| ROSC pulse | SW (A) = j | SW (B) = k |
|---|---|---|
| R1 | 0 | 0 |
| R2 | 3 | X |
| R3 | X | 3 |
| R4 | X | X |
| R5 | 2 | 1 |
| R6 | X | X |
| R7 | 3 | X |
| R8 | X | 4 |

Referring to FIGS. 5 and 6 and Table II, the first CLOCK' signal pulse C1 of the CLOCK' signal having period $2.35T_p$ is generated by conveying the first ROSC signal pulse R1 without delay. When clocked by the R2 ROSC signal pulse, sequencer 58 supplies control data SW(A)=3 to first coarse delay circuit 54 and SW(B)=X to second coarse delay circuit 56. In response to SW(A)=3, first coarse delay circuit 54 delays pulse R2 by $0.75T_p$ and supplies that delayed R2 pulse in the form of a CLOCK signal pulse to second coarse delay circuit 56. Sequencer 58 supplies the control data value SW(B)=3 to second coarse delay circuit 56 in response to ROSC pulse R3 telling it to delay that CLOCK signal pulse by $0.6T_p$. ROSC signal pulse R2 is thus delayed to produce the second CLOCK' signal pulse C2 with a total delay of $0.75T_p+0.6T_p=1.35T_p$.

The SW(B)=X data supplied in response to the R2 ROSC pulse tells second coarse delay circuit 56 to ground its output so that it does not produce a CLOCK' signal pulse during the interval between the R2 and R3 ROSC signal pulses. Sequencer 58 supplies control data SW(A)=X to first coarse delay circuit 54 in response to the R3 ROSC pulse telling it to block the ROSC pulse R3 since no CLOCK' pulse is to be derived from ROSC signal pulse R3.

To produce the third CLOCK' signal pulse C3 having a delay of $0.7T_p$ with respect to the R5 ROSC signal pulse, sequencer 58 concurrently supplies an SW(A)=2 data value to first coarse delay circuit 54 and an SW(B)=1 data value to second coarse delay circuit 56 in response to the R5 pulse. These SW(A) and SW(B) data values instruct coarse delay circuit 54 to delay the R5 pulse by $0.5T_p$ to produce another CLOCK signal pulse, and tell coarse delay circuit 56 to delay that CLOCK signal pulse by an additional $0.2T_p$ to produce CLOCK' signal pulse C3 having a total delay of $0.7T_p$ with respect to the R5 pulse. In a similar manner, clock signal generator 50 delays the R7 ROSC signal pulse of FIG. 6 by $1.05T_p$ to produce the remaining CLOCK' signal pulse C4. The R3, R4, R6 and R8 ROSC signal pulses are blocked and do not pass through coarse delay circuits 54 and 56 to become CLOCK' signal pulses.

Choosing N and M

Coarse delay circuits 54 and 56 of FIG. 5 provide a delay resolution of $T_p/(M*N)$ when N and M are "relatively prime" numbers, having no common factors other than 1. When N and M are not relatively prime numbers, the resolution with which clock signal generator 50 can adjust the delay of a given ROSC signal pulse will be lower than $T_p/(M*N)$.

The simple example of N=4 and M=5 used above in connection with Tables I and II illustrates the basic principle of the invention. However, in practice the values of N and M can be much larger than 4 and 5. Consider an example where N=16 and M=17 and the period $T_p$ of the ROSC signal is 2.5 ns. For this choice of relatively prime N and M numbers, the delay resolution of first coarse delay circuit 54 will be 2.5 ns/16=156.25 ps and the delay resolution of second coarse delay circuit 56 will be 2.5 ns/17=147.06 ps, but the resolution with which the delay of a ROSC signal pulse can be adjusted, will be 2.5 ns/(16*17)=2.5 ns/272=9.19 ps.

Coarse Delay Circuit Architecture

First coarse delay circuit 54 is suitably similar to prior art programmable delay circuit 24 of FIG. 1 and thus has an internal delay line similar to delay line 16 formed from a series of N logic gates 14 where each gate 14 provides a unit delay of $T_p/N$.

Figure 7:
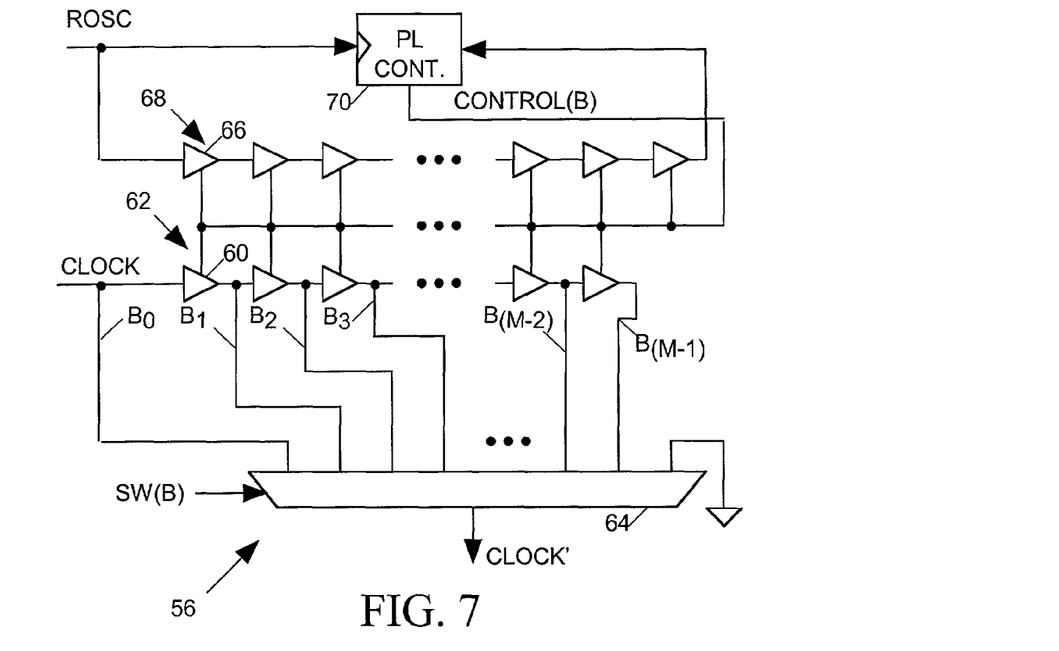
FIG. 7 depicts the second coarse delay circuit of FIG. 5 in more detailed block diagram form.

FIG. 7 depicts second coarse delay circuit 56 of FIG. 5 in more detailed block diagram form. The CLOCK signal from first coarse delay circuit 54 serves as input to a series of M−1 gates 60 forming a delay line 62 producing a series of tap signals $B_1$-$B_{M-1}$. The CLOCK signal (signal $B_0$) and tap signals $B_1$-$B_{M-1}$ provide inputs to a multiplexer 64 producing the output signal CLOCK' of clock signal generator 50 (FIG. 5). One additional multiplexer 64 input is grounded. Multiplexer 64 generates each pulse of the CLOCK' signal by selecting a pulse at one of its inputs and passing that pulse to its output. Sequencer 58 (FIG. 5) provides a control data sequence SW(B) telling multiplexer 64 which input to select in response to each ROSC signal pulse.

Another delay line 68 having M gates 66 receives the ROSC clock signal as input and provides the output of it's $M^{th}$ gate 66 as input to a phase lock controller 70. Controller 70 compares the output of the $M^{th}$ gate of delay line 68 to the ROSC signal and provides a control signal CONTROL(B) for controlling the switching speed of all gates 66 to phase lock the $M^{th}$ gate signal of delay line 68 to the ROSC signal thereby ensuring each gate 66 has a delay of $T_p/M$. The CONTROL (B) signal similarly adjusts the switching speed of the M−1 gates 60 of delay line 62 thereby ensuring that each gate 60 also provides a signal delay of $T_p/M$. Thus second coarse delay circuit 56 can adjustably delay CLOCK signal pulses over a range spanning $T_p*(1-1/M)$ with a resolution of $T_p/M$ to provide CLOCK' signal pulses.

Figure 8:
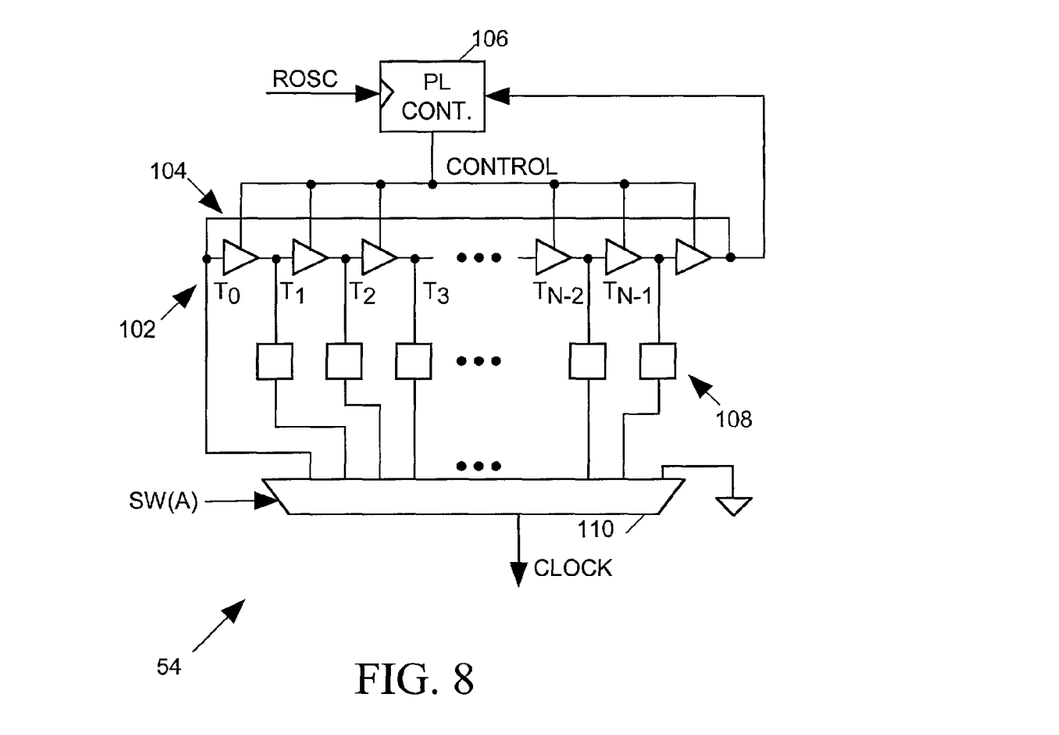
FIG. 8 depicts an alternative embodiment of the coarse delay circuit 54 of FIG. 5.

FIG. 8 depicts an alternative embodiment of first coarse delay circuit 54 of FIG. 5. Delay circuit 54 of FIG. 9 has N gates 102 connected in a loop to form a ring oscillator 104 producing a series of tap signals $T_0$-$T_{N-1}$ at the outputs of gates 102. A multiplexer 110 receives the tap signals $T_0$-$T_{N-1}$ as input signals after they have passed through a set of pulse-shaping circuits 108. Another multiplexer 110 input is grounded. A PL controller 106 compares the ROSC signal to the tap signal $T_N$ and provides a CONTROL signal to adjust the speed of gates 102 in the manner described above for the PL controller 18 of FIG. 1. Multiplexer 110 controls the timing of each pulse of its output signal CLOCK by selecting one of its input signals. Sequencer 58 of FIG. 5 provides a control data sequence SW(A) telling multiplexer 110 which input signal to select. The sequence of SW(A) data values controls the delay of each pulse of the CLOCK signal.

Thus has been shown and described a high resolution clock signal generator having two coarse delay circuits 54 and 56 (FIG. 5). First coarse delay circuit 54 adjustably delays pulses of the ROSC signal over a range spanning nearly $T_p$ seconds with a unit delay of $T_p/N$ seconds to provide pulses of the CLOCK signal. Second coarse delay circuit 56 adjustably delays pulses of the CLOCK signal of the first coarse delay circuit 54 over a range spanning nearly $T_p$ seconds with a unit delay of $T_p/M$ seconds to provide pulses of the CLOCK' signal. Thus the total delay of the output CLOCK' clock signal is $T_D = j*T_p/N + k*T_p/M = (j*M+k*N)*T_p/N*M$, where j and k are the number of unit delays provided by coarse delay circuits 54 and 56 respectively.

Preferably, the numbers N and M are selected so that they are "relatively prime", having no common factors other than one. Thus the resolution with which the clock signal generator can delay a reference signal pulse, and therefore set the period of its output clock signal, is $T_p/(M*N)$.

First coarse delay circuit 54 of FIG. 5 preferably uses either phase-locked delay line 16 (FIG. 1) or phase-locked ring oscillator 104 (FIG. 8) phase-locked to the reference signal by phase-lock controllers 18 (FIG. 1) or 106 (FIG. 8), respectively, to control the delay of its input signal. Likewise, second coarse delay circuit 56 of FIG. 5 preferably uses phase-locked delay line 62 (FIG. 7) phase-locked to the reference signal by phase-lock controller 70 (FIG. 7) to control the delay of its input signal. Thus both coarse delay circuits 54 and 56 are self-calibrating.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for generating pulses of a third pulse sequence in response to pulses of a periodic first pulse sequence having a period $T_p$, wherein timing of each pulse of the third pulse sequence is adjustable with a resolution that is smaller than period $T_p$, the apparatus comprising:
   first means for generating each pulse of a second pulse sequence in response to a separate pulse of the first pulse sequence with a first delay adjustable by first control data with a resolution of $T_p/N$ over a first range substantially wider than $T_p/M$, wherein M and N are differing integers greater than one;
   second means for generating each pulse of the third pulse sequence in response to a separate pulse of the second pulse sequence with a delay adjustable by a second control data with a resolution of $T_p/M$ over a second range substantially wider than $T_p/N$; and
   a programmable sequencer for changing a magnitude of the first control data and a magnitude of the second control data in response to each pulse of the first pulse sequence such that the magnitudes of the first and second control data vary repetitively in a programmably adjustable manner.

2. The apparatus in accordance with claim 1 wherein M and N are relatively prime.

3. The apparatus in accordance with claim 1 wherein at least one of said first and second ranges is wider than $T_p$.

4. The apparatus in accordance with claim 1 wherein the first range is at least as wide as $(1-1/N)T_p$ and the second range is at least as wide as $(1-1/M)T_p$.

5. The apparatus in accordance with claim 4 wherein M and N are relatively prime.

6. The apparatus in accordance with claim 1 wherein the third pulse sequence is periodic.

7. The apparatus in accordance with claim 1
   wherein the first means comprises a plurality of first gates connected in series for generating pulses of the second pulse sequence in response to pulses of the first pulse sequence,
   wherein each first gate has a switching delay of $T_p/N$.

8. The apparatus in accordance with claim 1
wherein the second means comprises a plurality of second gates connected in series for generating pulses of the third pulse sequence in response to pulses of the second pulse sequence; and
wherein each second gate has a switching delay of $T_p/M$.

9. The apparatus in accordance with claim 8
wherein the second means further comprises M third gates connected in series for generating a fourth pulse sequence in delayed response to the first pulse sequence; and
wherein each second and third gate has a similar switching delay of $T_p/M$ set by the magnitude of a second control signal applied to all of the second and third gates.

10. The apparatus in accordance with claim 9 wherein the second means further comprises means for monitoring a phase relationship between the first pulse sequence and the fourth pulse sequence and adjusting the magnitude of the second control signal so that the fourth pulse sequence is phase-locked to the first pulse sequence.

11. The apparatus in accordance with claim 1
wherein the first means comprises a plurality of first gates connected in series for generating pulses of the second pulse sequence in response to pulses of the first pulse sequence;
wherein the second means comprises a plurality of second gates connected in series for generating pulses of the third pulse sequence in response to pulses of the second pulse sequence;
wherein each first gate has a switching delay of $T_p/N$; and
wherein each second gate has a switching delay of $T_p/M$.

12. The apparatus in accordance with claim 11
wherein the second means further comprises M third gates connected in series for generating a fourth pulse sequence in delayed response to the first pulse sequence; and
wherein each second and third gate has a similar switching delay of $T_p/M$ set by the magnitude of a second control signal applied to all of the second and third gates.

13. The apparatus in accordance with claim 12 wherein the second means further comprises means for monitoring a phase relationship between the first pulse sequence and the fourth pulse sequence and adjusting the magnitude of the second control signal so that the fourth pulse sequence is phase-locked to the first pulse sequence.

14. The apparatus in accordance with claim 13
wherein said plurality of first gates includes N first gates connected in series and delaying the first pulse sequence to produce a fifth pulse sequence;
wherein the switching delay of each of said first gates is controlled by a magnitude of the first control signal supplied as input thereto; and
wherein the first means further comprises means for monitoring the first pulse sequence and the fifth pulse sequence and for adjusting the magnitude of the first control signal so that the fifth pulse sequence is phase-locked to The first pulse sequence.

15. An apparatus for generating pulses of a third pulse sequence in response to pulses of a periodic first pulse sequence having a period $T_p$, wherein timing of each pulse of the third pulse sequence is adjustable with a resolution that is smaller than $T_p$, the apparatus comprising:
first means for generating each pulse of a second pulse sequence in response to a separate pulse of the first pulse sequence with a delay adjustable by first control data with a resolution of $T_p/N$;
second means for generating each pulse of the third pulse sequence in response to a separate pulse of the second pulse sequence with a delay adjustable by a second control data with a resolution of $T_p/M$;
a programmable sequencer for changing a magnitude of the first control data and a magnitude of the second control data in response to each pulse of the first pulse sequence such that the magnitudes of the first and second control data vary repetitively in a programmably adjustable manner,
wherein the first means comprises a plurality of first gates connected in series for generating pulses of the second pulse sequence in response to pulses of the first pulse sequence,
wherein the second means comprises a plurality of second gates connected in series for generating pulses of the third pulse sequence in response to pulses of the second pulse sequence,
wherein each first gate has a switching delay of $T_p/N$,
wherein each second gate has a switching delay of $T_p/M$,
wherein the second means further comprises M third gates connected in series for generating a fourth pulse sequence in delayed response to the first pulse sequence, and
wherein each second and third gate has a similar switching delay of $T_p/M$ set by the magnitude of a second control signal applied to all of the second and third gates.

16. The apparatus in accordance with claim 15 wherein the second means further comprises means for monitoring the first pulse sequence and the fourth pulse sequence and adjusting the magnitude of the second control signal so that the fourth pulse sequence is phase-locked to the first pulse sequence.

17. The apparatus in accordance with claim 16
wherein said plurality of first gates comprises N first gates connected in series and delaying the first pulse sequence to produce a fifth pulse sequence;
wherein the switching delay of each of said first gates is controlled by a magnitude of a first control signal supplied as input thereto; and
wherein the first means further comprises means for monitoring a phase relationship between the first pulse sequence and the fifth pulse sequence and for adjusting the magnitude of the first control signal so that the fifth pulse sequence is phase-locked to the first pulse sequence.

18. A method for generating pulses of a third pulse sequence in response to pulses of a periodic first pulse sequence having a period $T_p$, wherein timing of each pulse of the third pulse sequence is adjustable with a resolution that is smaller than a period $T_p$, the method comprising the steps of:
a. generating each pulse of a second pulse sequence in response to a separate pulse of the first pulse sequence with a first delay adjustable by first control data with resolution of $T_p/N$ over a first range substantially wider than $T_p/M$, wherein M and N are differing integers greater than one;
b. generating each pulse of the third pulse sequence in response to a separate pulse of the second pulse sequence with a delay adjustable by a second control data with a resolution of $T_p/M$ over a second range substantially wider than $T_p/N$; and
c. changing a magnitude of the first control data and the second control data in response to each pulse of the first pulse sequence such that the magnitudes of the first and second control data vary repetitively in a programmably adjustable manner.

19. The method in accordance with claim 18 wherein M and N are relatively prime.

20. The method in accordance with claim 18 wherein at least one of said first and second ranges is wider than $T_p$.

21. The method in accordance with claim 18 wherein the first and second ranges are each at least as wide as $T_p$.

22. The method in accordance with claim 21 wherein M and N are relatively prime.

23. The method in accordance with claim 18 wherein the third pulse sequence is periodic.

24. The method in accordance with claim 18
wherein step a comprises applying the first pulse sequence as input to a plurality of first gates connected in series so that the first gates generate pulses of the second pulse sequence; and wherein each first gate has a switching delay of $T_p/N$.

25. The method in accordance with claim 18
wherein step b comprises applying the second pulse sequence as input to a plurality of second gates connected in series so that the second gates generate pulses of the third pulse sequence; and
wherein each second gate has a switching delay of $T_p/M$.

26. The method in accordance with claim 25
wherein step b comprises applying the first pulse sequence as input to M third gates connected in series so that the third gates generate pulses of a fourth pulse sequence in delayed response to the first pulse sequence; and
wherein each second and third gate has a similar switching delay of $T_p/M$ set by a magnitude of a control signal applied to all of the second and third gates.

27. The method in accordance with claim 26
wherein step b comprises the substeps of:
b1. monitoring a phase relationship between the first pulse sequence and the fourth pulse sequence; and
b2. adjusting the magnitude of the control signal so that the fourth pulse sequence is phase-locked to the first pulse sequence.

28. The method in accordance with claim 18
wherein step a comprises applying the first pulse sequence as input to a plurality of first gates connected in series so that the first gates generate pulses of the second pulse sequence;
wherein step b comprises applying the second pulse sequence as input to a plurality of second gates Connected in series so that the second gates generate pulses of the third pulse sequence;
wherein each first gate has a switching delay of $T_p/N$; and
wherein each second gate has a switching delay of $T_p/M$.

29. The method in accordance with claim 28
wherein step b comprises applying the first pulse sequence as input to M third gates connected in series so that the third gates generate pulses of a fourth pulse sequence in delayed response to the first pulse sequence; and
wherein each second and third gate has a similar switching delay of $T_p/M$ set by the magnitude of a second control signal applied to all of the second and third gates.

30. The method in accordance with claim 29 wherein step b comprises the substeps Of:
b1. monitoring a phase relationship between the first pulse sequence and the fourth pulse sequence; and
b2. adjusting the magnitude of the second control signal so that the fourth pulse sequence is phase-locked to the first pulse sequence.

31. The method in accordance with claim 30
wherein said plurality of first gates comprises N first gates connected in series and delaying the first pulse sequence to produce a fifth pulse sequence;
wherein the switching delay of each of said first gates is controlled by a magnitude of a first control signal supplied as input thereto; and
wherein step a comprises the substeps of:
a1. monitoring a phase relationship between the first pulse sequence and the fifth pulse sequence; and
a2. adjusting the magnitude of the first control signal so that the fifth pulse sequence is phase-locked to the first pulse sequence.

32. A method for generating pulses of a third pulse sequence in response to pulses of a periodic first pulse sequence having a period $T_p$, wherein timing of each pulse of the third pulse sequence is adjustable with a resolution that is smaller than $T_p$, the method comprising the steps of:
a. generating each pulse of a second pulse sequence in response to a separate pulse of the first pulse sequence with a delay adjustable by a first control data with a resolution of $T_p/N$;
b. generating each pulse of the third pulse sequence in response to a separate pulse of the second pulse sequence with a delay adjustable by a second control data with a resolution of $T_p/M$; and
c. changing a magnitude of the first control data and a magnitude of the second control data in response to each pulse of the first pulse sequence such that the magnitudes of the first and second control data vary repetitively in a programmably adjustable manner, wherein M and N are relatively prime integers greater than one.

33. The method in accordance with claim 32
wherein step a comprises applying the first pulse sequence as input to a plurality of first gates connected in series so that the first gates generate pulses of the second pulse sequence;
wherein step b comprises applying the second pulse sequence as input to a plurality of second gates connected in series so that the second gates generate pulses of the third pulse sequence;
wherein each first gate has a switching delay of $T_p/N$; and
wherein each second gate has a switching delay of $T_p/M$.

34. The method in accordance with claim 33
wherein step b comprises applying the first pulse sequence as input to M third gates connected in series so that the third gates generate pulses of a fourth pulse sequence in delayed response to the first pulse sequence; and
wherein each second and third gate has a similar switching delay of $T_p/M$ set by the magnitude of a second control signal applied to all of the second and third gates.

35. The method in accordance with claim 34 wherein step b comprises the substeps of:
b1. monitoring a phase relationship between the first pulse sequence and the fourth pulse sequence; and
b2. adjusting the magnitude of the second control signal so that the fourth pulse sequence is phase-locked to the first pulse sequence.

36. The method in accordance with claim 35
wherein said plurality of first gates comprises N first gates connected in series and delaying the first pulse sequence to produce a fifth pulse sequence;
wherein the switching delay of each of said first gates is controlled by a magnitude of a first control signal supplied as input thereto; and
wherein step a comprises the substeps of:
a1. monitoring a phase relationship between the first pulse sequence and the fifth pulse sequence; and
a2. adjusting the magnitude of the first control signal so that the fifth pulse sequence is phase-locked to the first pulse sequence.

* * * * *